315-3·5 SEARCH ROOM

Jan. 26, 1960 M. WASSERMAN 2,922,918

TRAVELING WAVE OSCILLATORS

Filed Jan. 16, 1956 3 Sheets-Sheet 1

Jan. 26, 1960 M. WASSERMAN 2,922,918

TRAVELING WAVE OSCILLATORS

Filed Jan. 16, 1956 3 Sheets-Sheet 3

United States Patent Office 2,922,918

Patented Jan. 26, 1960

2,922,918

TRAVELING WAVE OSCILLATORS

Marien Wasserman, Paris, France, assignor to Compagnie Generale de Telegraphie Sans Fil, a corporation of France Application January 16, 1956, Serial No. 559,442

Claims priority, application France January 17, 1955

6 Claims. (Cl. 315—3.5)

This invention relates to traveling wave oscillators.

Traveling wave oscillators having a wide uninterrupted frequency band are already known wherein tuning is entirely electrical. While this is generally an extremely advantageous feature, it may happen, under certain conditions, that electrical tuning is undesirable and a convenient mechanical tuning is preferred.

It is an object of the present invention to provide a traveling wave oscillator having a broad band characteristic and in which tuning is performed through the medium of entirely mechanical means which are located outside the tube and operated from outside the same.

The traveling wave oscillator according to the invention is provided with a delay structure which is not dispersive at least for a predetermined frequency band. The load, which must be mismatched to a certain extent, is coupled to one end of the delay line, while a tunable high Q cavity resonator is coupled to its other end, means being provided for avoiding any reflection at this latter end.

The invention will be better understood from the ensuing description with reference to the appended drawing, wherein.

Figure 1:
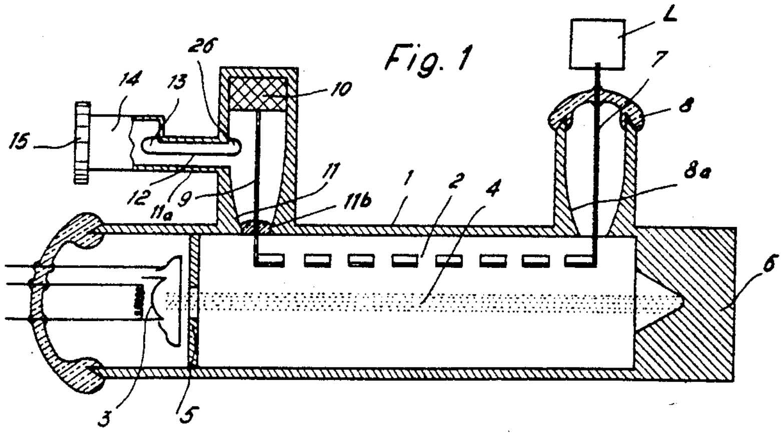
Fig. 1 shows in longitudinal section a first embodiment of the oscillator according to the invention.

Fig. 1 shows a first embodiment of the oscillator according to the invention. It comprises, within an evacuated envelope 1, a delay line 2 and an electron gun 3. An electron beam 4, which is emitted by the gun 3, is accelerated by an anode 5, is propagated parallel to delay line 2 and is collected by a collector 6. Preferably, the delay line is as little attenuating as possible.

An output is provided at the collector end of the tube. For instance, the corresponding end of the line 2 is connected to an output conductor 7 passing through a glass-cap 8 which seals the end of an output wave guide 8*a*. The latter is shaped always to allow for a slight mismatch to subsist between line 2 and the load diagrammatically shown at L. At the opposite or cathode end, line 2 is connected, by means of an input conductor 9 extending through an insulating seal 11*b* and an input waveguide 11, to an absorption block 10 located at the closed end of the guide 11 remote from the envelope 1. The material and shape of block 10 must be such as to provide a substantially perfect matching in the operating frequency band of the tube. The waveguide 11 is provided with a lateral stub 11*a* opening into a high Q cavity resonator 14. A probe 12 having terminal loops 13 and 26 couples the guide 11 to resonator 14. The latter may be tuned, for instance, by means of cover 15, screwed thereon and allowing its volume to be varied.

The oscillator of Fig. 1 may be tuned in a continuous broad band by tuning cavity resonator 14. This remarkable result is obtained only if delay line 2 has a dispersion substantially equal to zero in the operating frequency band of the tube, i.e. if the frequency is substantially independent from the velocity of the beam 4. This is the case when the delay line displays a dispersion characteristic of the type shown in Figs. 5 and 6.

These figures show dispersion curves, i.e. curves obtained by plotting the delay ratio $c/v$ as a function of $\lambda$, $c$ being the velocity of the light and $v$ the phase velocity of a wave propagating in the delay line and $\lambda$ the operating wavelength of the oscillator. As is well known, branches AB and DF correspond to the fundamental space harmonic and branches AC and EF to the first space harmonic of the energy propagating in the delay line. It is further known that branches AB and EF correspond to a direct mode, i.e. to a space harmonic, the phase velocity of which is of same sign as the group velocity of the energy, and branches AC and DF to a reverse mode, i.e. to a space harmonic the phase velocity of which is of opposite sign to the group velocity of the energy.

Figure 5:
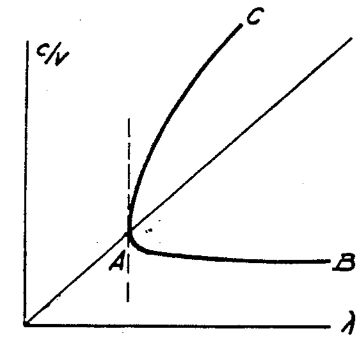
Figs. 5 and 6 show dispersion curves of delay lines which may be used in the tube according to the invention.
Figure 13:
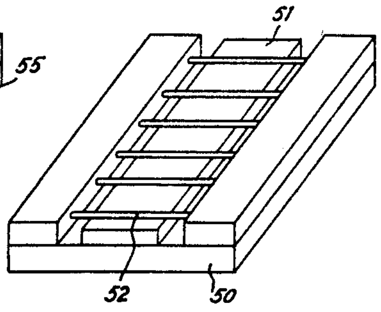

Fig. 5 corresponds, for instance to a helical delay line, or to a ladder type delay line as shown in Fig. 13, i.e. one having a black plate 50 and a wedge 51 located near the central portion of the rungs 52.

Figure 6:
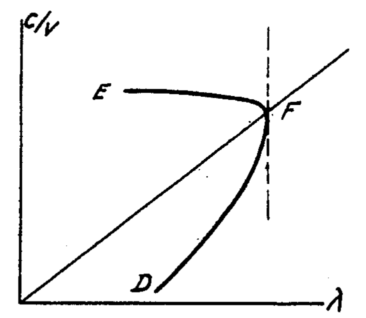
Figure 10:
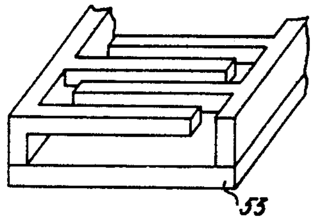
Figs. 10 to 13 show examples of delay lines for use in the oscillator of the invention.
Figure 11:
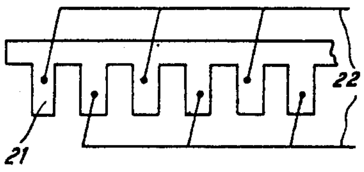
Figure 12:
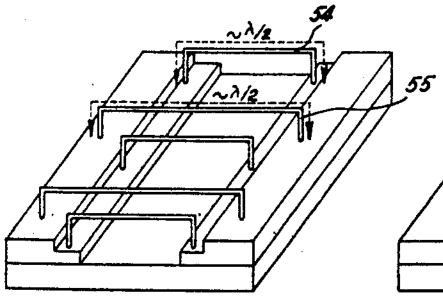

Fig. 6 corresponds, for instance to an interdigital line with a back plate 53 as shown in Fig. 10, to a delay line having vanes 21, alternately connected with straps 22 as shown in Fig. 11, or to a ladder shaped line with two sets of rungs, 54 and 55, as shown in Fig. 12.

Lines of this and other types, suitable for the purposes of the invention, were described in a co-pending application Serial No. 356,050 of May 19, 1953, assigned to the same assignee.

While it is by no means the applicant's intention to be limited by any explanation, it appears that the operation of the oscillator according to the invention may be broadly explained in the following way.

It is known that in any traveling wave tube, which is mismatched at the cathode or at the collector end, some kind of oscillation may be provided by reflection at one end of the tube or at both ends. However, in known tubes of this kind, it is not possible to provide continuous uninterrupted tuning within a broad frequency band. This would be possible only if the electrical length of the feedback circuit comprising the delay line were, for any frequency of this band, equal to $2\pi N$, N being an integer, and this is a physical impossibility.

Now it is known that the phase shift corresponding to a high Q cavity resonator varies rapidly between $+\pi$ and $-\pi$ as a function of the frequency within a very narrow band in the vicinity of the resonant frequency of the cavity, and that the phase shift variation with frequency of the delay line is much slower. Therefore, if, for a given frequency F, the total phase-shift of the delay line 2 is not equal to $2\pi N$, N being an integer, it is possible, by adding the resonator 14 to the delay line, to make the total phase shift of delay line 2 and resonator 14, taken together, equal to $2\pi N$, for a desired oscillation frequency $F\pm\epsilon$, the frequency shift $\epsilon$ being practically negligible. This being true for any frequency within the tuning band of cavity 14, it is possible to tune the oscillator within the same band without any frequency gap and all along the dispersion curve branch, AB or EF, corresponding to a zero dispersion. Matched absorbing means, for avoiding any reflection at the delay line, are coupled to cavity 14, thus defining a single feedback circuit comprising delay line 2 and cavity 14 and avoiding formation of any other feedback circuit which would not comprise cavity resonator 14 and hence could provide oscillations independent of the tuning thereof.

Theory and experience show that, while being continuously tunable within a broad uninterrupted frequency band, the tube of the invention also displays an excellent pulling figure.

When the tube is intended to be pulse operated it is preferable to provide it with a line having a characteristic according to Figure 6. This makes it possible to avoid any parasitic oscillation in the $\pi$ mode. As is known, such oscillations correspond to point A in Fig. 5 and to point F in Fig. 6. They are liable to occur when the electron velocity $v$ passes through the values corresponding to these two points respectively, at which the tangent to the curve is vertical, i.e. the variation of wavelength as a function of phase velocity changes sign. Moreover, once they have started, these oscillations are liable to persist for other values of $v$, so that parasitic oscillation in the $\pi$ mode may well coexist with oscillations in the desired frequency.

In direct mode operation, when the electron velocity is increased, the operating point shifts from left to right along the branches AB or EF, of the dispersion curves of Figs. 5, or 6 respectively, i.e. from A to B in Fig. 5 and from E to F in Fig. 6. Now, when the tube is pulse operated, the electron velocity starts from zero, reaches a certain maximum value and returns to zero. It is seen that, in the case of Fig. 5, the electron beam velocity always passes through the value corresponding to point A, while in the case of Fig. 6, the operation may take place along branch EF without ever reaching point F. This is why, if the oscillator according to the invention is pulse operated, a delay line having a dispersion curve of the type shown in Fig. 6, i.e. a delay line having a direct propagation for the first space harmonic, is preferred.

Figure 2:
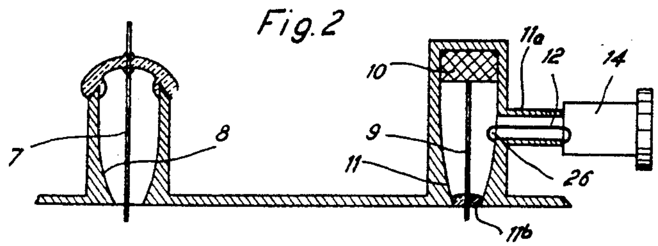
Figs. 2 to 4 show three modified embodiments of the invention.
Figure 3:
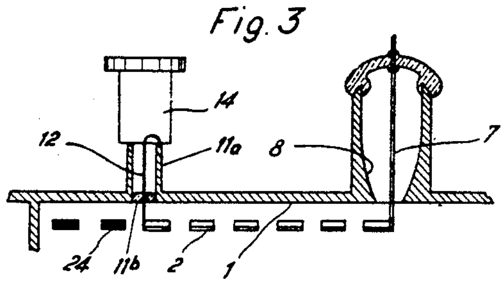
Figure 4:
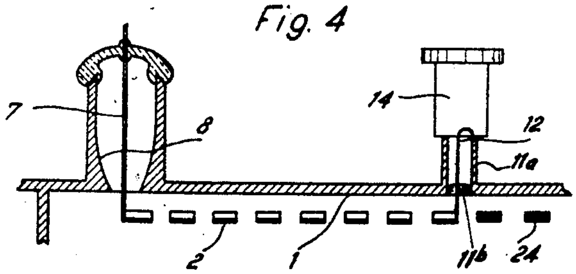

Some modifications of the tube of Fig. 1 are shown in Figs. 2, 3 and 4, where only the modified portion in Fig. 1 has been represented.

In the modification of Fig. 2, the respective positions of the output 7—8 and of the resonator 14 have been reversed.

In the modified embodiment of Fig. 3, the absorbing block 10 has been omitted, its function being taken over by an attenuation provided on, or at least in the ultra high frequency field of, an end portion 24 of delay line 2. Probe 12 directly connects, in this case, line 2 to resonator 14.

In the modified embodiment of Fig. 4, the respective positions of the output 7—8 and of the resonator 14 and attenuation 24 of Fig. 3 have been reversed, similarly to the embodiment of Fig. 2.

Figure 7:
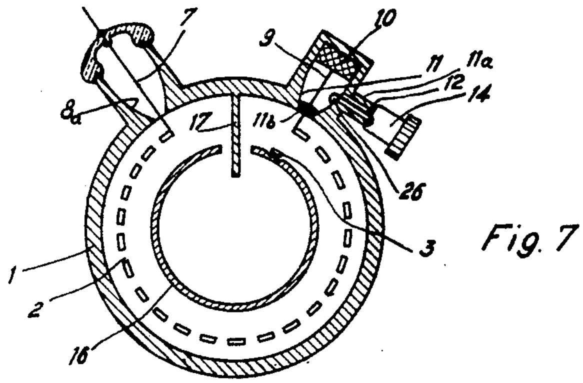
Fig. 7 shows a cross-section of another embodiment of the tube according to the invention.
Figure 8:
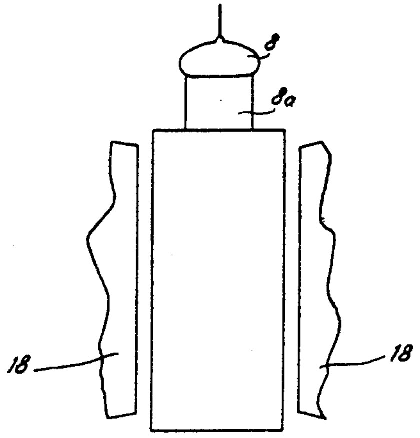
Fig. 8 is a simplified side view of the tube of Fig. 7.

Figs. 7 and 8 show a further modification of the invention. The tube is of the well known "M" type, i.e. it operates with crossed magnetic and electric fields, and therefore need not be described in detail. It comprises a positively biassed delay line 2, a negative electrode 16 supporting a cathode 3, and a screen 17, connected to envelope 1, which serves both to uncouple the ends of line 2 and as a collector for the beam. A transverse magnetic field is provided by pole pieces 18 shown in Fig. 8.

Output 7—8 and resonator 14 may be located as in any one of Fig. 1 to 4 inclusive. The actual arrangement of Fig. 7 corresponds to the arrangement of Fig. 1.

Figure 9:
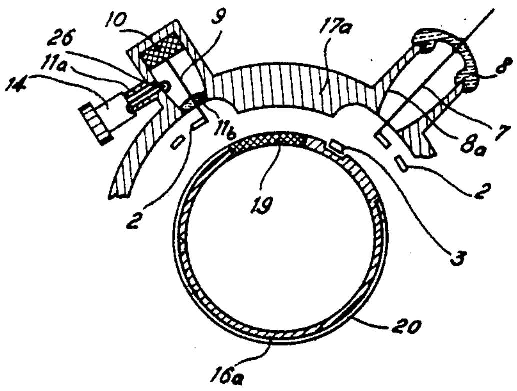
Fig. 9 shows a detail view of another tube according to the invention.

In Fig. 9, the invention is applied to a simplified tube in which screen **17*a* uncouples the ends of line 2 only, while the electrode 16*a* is in the shape of a closed cylinder. In this manner, there is an undesired feedback circuit through the beam, and to escape this drawback, there is provided, as known per se, an electron absorbing substance along the portion 19 of the periphery of cylinder 16*a***. The invention is applicable to this tube, in accordance with any of the modifications shown in Figs. 1 to 4 inclusive.

By way of example, the arrangement of Fig. 2 has been applied to the tube of Fig. 9 in which the resonator 14 is connected at the collector end of the tube and the output 7—8 is at the cathode end.

It is, of course, to be understood that the above examples have been given for purposes of illustration only and are by no means limitative, the invention being applicable to any type of traveling wave tube oscillator.

I claim:

1. An ultra high frequency traveling wave oscillator tube comprising: a delay line having two ends and including means providing substantially non-dispersive characteristics of delay ratio versus wavelength for a predetermined frequency band; an electron source positioned to project a non-re-entrant electron beam in coupled relationship with said line at a predetermined velocity corresponding to said frequency band of energy induced in said line; output means at one end of said line coupled to an external load circuit, said circuit being mismatched to said line; a high Q tunable cavity resonator coupled to the other end of said line for receiving energy therefrom; and energy absorbing means in the ultra high frequency field of said other end of said line and substantially matched to said line within said frequency band.

2. An ultra high frequency traveling wave oscillator tube comprising: a delay line having two ends and including means providing substantially non-dispersive characteristics of delay ratio versus wavelength for a predetermined frequency band; an electron source positioned to project a non-re-entrant electron beam in coupled relationship with said line at a predetermined velocity corresponding to said frequency band of energy induced in said line; output means at one end of said line coupled to an external load circuit, said circuit being mismatched to said line; a wave guiding duct having a first closed end and a second end coupled to the other end of said line; energy absorbing means at said closed end of said duct and substantially matched to said line within said frequency band; and a high Q tunable cavity resonator coupled to said duct for receiving energy therefrom.

3. An ultra high frequency traveling wave oscillator tube comprising: a delay line having two ends and including means providing substantially non-dispersive characteristics of delay ratio versus wavelength for a predetermined frequency band; an electron source positioned to project a non-re-entrant electron beam in coupled relationship with said line at a predetermined velocity corresponding to said frequency band of energy induced in said line; output means at one end of said line coupled to an external load circuit, said circuit being mismatched to said line; a wave guiding duct having a first closed end and a second end coupled to the other end of said line; energy absorbing means at said other end of said line and substantially matched to said line within said frequency band; and a high Q tunable cavity resonator coupled to said duct for receiving energy therefrom.

4. An ultra high frequency traveling wave oscillator tube comprising: a delay line having two ends and including means providing substantially non-dispersive characteristics of delay ratio versus wavelength for a predetermined frequency band in the direct fundamental mode; an electron source positioned to project a non-re-entrant electron beam in coupled relationship with said line at a predetermined velocity corresponding to said frequency band of energy induced in said line; output means at one end of said line coupled to an external load circuit, said circuit being mismatched to said line; a high Q tunable cavity resonator coupled to the other end of said line for receiving energy therefrom; and energy absorbing means positioned in the ultra high frequency field of said other end of said line and substantially matched to said line within said frequency band.

5. An ultra high frequency traveling wave oscillator tube comprising: a delay line having two ends and including means providing substantially non-dispersive characteristics of delay ratio versus wavelength for a predetermined frequency band in the direct first harmonic mode; an electron source positioned to project a non-re-entrant electron beam in coupled relationship with said line at a predetermined velocity corresponding to said frequency band of energy induced in said line; output means at one end of said line coupled to an external load circuit, said circuit being mismatched to said line; a high Q tunable cavity resonator coupled to the other end of said line for receiving energy therefrom; and energy absorbing means in the ultra high frequency field of said other end of said line and substantially matched to said line within said frequency band.

6. An ultra high frequency traveling wave oscillator tube comprising: a delay line having two ends and including means providing substantially non-dispersive characteristics of delay ratio versus wavelength for a predetermined frequency band; an electron source positioned to project a non-re-entrant electron beam in coupled relationship with said line within a predetermined limited velocity range corresponding to said frequency band of energy induced in said line; output means at one end of said line coupled to an external load circuit, said circuit being mismatched to said line; a high Q tunable cavity resonator coupled to the other end of said line for receiving energy therefrom; and energy absorbing means in the ultra high frequency field of said other end of said line and substantially matched to said line within said frequency band.

References Cited in the file of this patent

UNITED STATES PATENTS

| | | |
|---|---|---|
| 2,580,007 | Dohler | Dec. 25, 1951 |
| 2,644,889 | Finke | July 7, 1953 |
| 2,782,339 | Nergaard | Feb. 19, 1957 |
| 2,800,605 | Marchese | July 23, 1957 |
| 2,811,641 | Birdsall | Oct. 29, 1957 |

FOREIGN PATENTS

| | | |
|---|---|---|
| 1,043,066 | France | June 10, 1953 |
| 699,893 | Great Britain | Nov. 18, 1953 |
| 705,885 | Great Britain | Mar. 17, 1954 |